Jan. 26, 1971 C. C. WYCKOFF, JR 3,559,086

BIPOLAR VOLTAGE AMPLIFIER

Filed March 26, 1969

INVENTOR
C. C. WYCKOFF, JR.
BY Bryon W. Sheffield
ATTORNEY

United States Patent Office 3,559,086

Patented Jan. 26, 1971

3,559,086

BIPOLAR VOLTAGE AMPLIFIER

Charles Clifford Wyckoff, Jr., Trenton, N.J., assignor to Western Electric Company, Incorporated, New York, N.Y., a corporation of New York Filed Mar. 26, 1969, Ser. No. 810,633

Int. Cl. H03f *3/18, 3/26*

U.S. Cl. 330—15 4 Claims

ABSTRACT OF THE DISCLOSURE

A bipolar voltage amplifier having a relatively high output voltage and a relatively high slewing rate. Input signals are applied to the emitters of a pair of serially-connected complementary transistors in common-emitter configuration. The amplified signals developed across the collectors of the first pair of transistors are fed to the emitters of a second pair of complementary transistors connected in push-pull, common-base configuration.

BACKGROUND OF THE INVENTION

(1) Field of the invention

This invention relates to an amplifier and more particularly to a bipolar amplifier having a relatively high output voltage.

(2) Background of the invention

The output voltages developed by electronic computers, operational amplifiers and the like are typically low, for example, 10 volts peak-to-peak. Many engineering applications, however, require output voltages of considerably higher magnitude, for example, 200 volts peak-to-peak. It is possible, of course, to connect an ordinary voltage amplifier to the output of such a low-level device and thereby obtain the desired output voltage. If this is done, the power supply for the amplifier must, of necessity, supply at least 200 volts and frequently more. This in turn dictates that the collector-to-emitter breakdown voltage of any transistors used in the amplifier be at least equal to the potential of the power supply. Such transistors are expensive but, more importantly, transistors capable of operating at these high voltages prevent the amplifier circuit from attaining a satisfactory slewing rate. That is to say, they impair the transient response of the overall circuit.

SUMMARY OF THE INVENTION

The problem of providing a bipolar amplifier which generates the necessary output voltage but which has a satisfactory slewing rate has been solved by the instant invention which comprises a bipolar amplifier including first and second transistors of opposite polarity each having a base, an emitter and a collector; circuitry connecting sources of opposite polarity to the collectors of said first and second transistors respectively; input circuitry connecting the signal to be amplified to the emitters of said first and second transistors; circuitry interconnecting the bases of said first and second transistors and ground; and means, connected to the collectors of said first and second transistors, for amplifying in Class B fashion the voltages developed thereacross to produce an output signal.

OBJECT OF THE INVENTION

It is an object of this invention to provide a transistorized bipolar amplifier having a relatively high output voltage.

It is a further object of this invention to provide a high voltage, transistorized, bipolar amplifier having a relatively high slewing rate.

DETAILED DESCRIPTION

Figure 1:
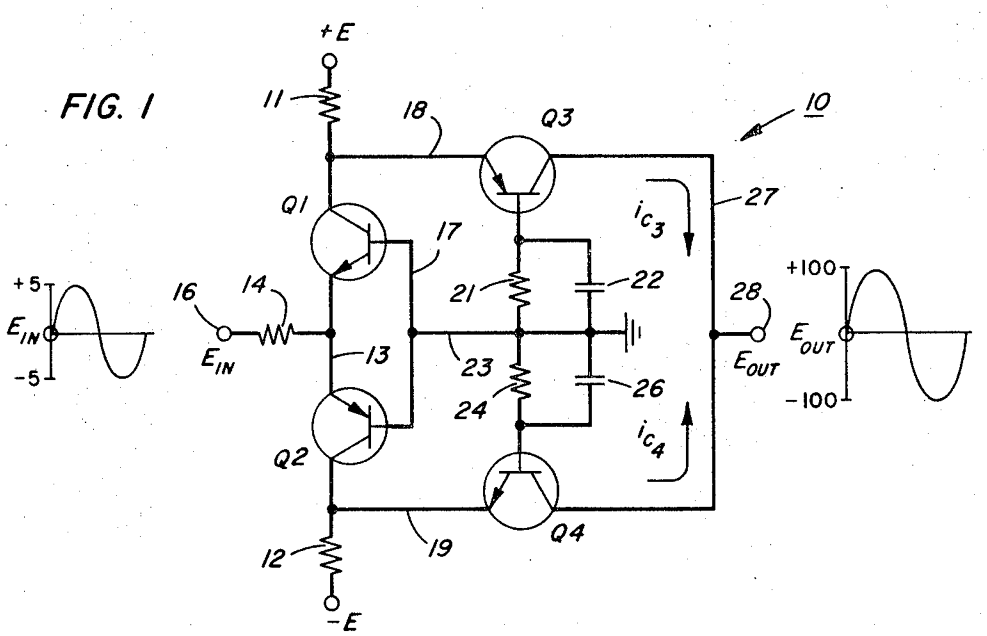
FIG. 1 is a schematic drawing of a transistorized bipolar amplifier according to the invention.

FIG. 1 is a schematic drawing of a preferred embodiment of the invention. As shown therein, bipolar amplifier 10 comprises a pair of complementary transistors $Q_1$ and $Q_2$ each having base, emitter and collector electrodes. The collector of transistor $Q_1$ is connected via a resistor 11 to a source of positive potential +E. The collector of transistor $Q_2$ is similarly connected via a resistor 12 to a source of negative potential —E, which is equal in absolute magnitude to the potential of source +E. The emitter electrodes of transistors $Q_1$ and $Q_2$ are connected together by a circuit 13 thence, via a resistor 14, to an input terminal 16. The base electrodes of transistors $Q_1$ and $Q_2$ are also connected together via a circuit 17, thence to ground.

The bipolar amplifier further comprises a second pair of complementary transistors $Q_3$ and $Q_4$ both having base, emitter and collector electrodes. The emitter of transistor $Q_3$ is connected via a circuit 18 to the collector of transistor $Q_1$ and the emitter of transistor $Q_4$ is similarly connected via a circuit 19 to the collector of transistor $Q_2$.

The base of transistor $Q_3$ is connected via the parallel connection of a resistor 21 and a capacitor 22 to circuit 23 and thence to ground. In a similar manner, the base of transistor $Q_4$ is connected via the parallel connection of a resistor 24 and a capacitor 26 to circuit 23 and ground. Capacitors 22 and 26, sometimes referred to as the "speed-up" capacitors in the art because they improve the transient response of the amplifier, i.e., "speed-up" the response, may be omitted in some applications without affecting the overall operation of the circuit. The collectors of transistors $Q_3$ and $Q_4$ are connected together via a circuit 27, thence to an output 28.

In operation, assume that the input signal to the bipolar amplifier is momentarily zero. Since the bases of transistors $Q_1$ and $Q_2$ are grounded and since no current is being fed from input terminal 16 through input resistor 14 to the emitter electrode of either transistor, both transistors $Q_1$ and $Q_2$ will be "cut-off." Because transistors $Q_1$ and $Q_2$ are "cut-off," the voltages on the collectors thereof are approximately equal to the supply potentials +E and —E respectively. The emitters of transistors $Q_3$ and $Q_4$ are connected to the collectors of transistors $Q_1$ and $Q_2$ respectively and, since the bases of transistors $Q_3$ and $Q_4$ are connected to ground via resistors 23 and 24 respectively, transistors $Q_3$ and $Q_4$ will be "on." Because the circuitry of the bipolar amplifier is symmetrical, the collector current $i_{c3}$ from transistor $Q_3$ flowing in circuit 27 will be equal and opposite to the current $i_{c3}$ from transistor $Q_4$ and no net output voltage will be developed across any external load connected to output terminal 28. In this respect, the operation of the circuit resembles Class B push-pull operation.

Consider now the case when the input voltage goes positive to, say, +5 volts. Under this condition a positive current will flow through resistor 14 into the emitter of transistor $Q_2$ turning this transistor "on." Transistor $Q_1$ remains "off" at this time for the reasons previously stated. Because transistor $Q_2$ is now "on," a finite collector current flows down through resistor 12 causing the potential at the collector of transistor $Q_2$ to become less negative. The change in potential at the collector of transistor $Q_2$ is passed via circuit 19 to the emitter of transistor $Q_4$ causing a corresponding drop in its collector circuit $i_{c4}$. Because transistor $Q_4$ is "off," no change occurs in the condition of transistor $Q_3$ and its collector current $i_{c3}$ remains unchanged. The two currents are no longer equal and thus no longer cancel out in circuit 27 and $i_{c3}$, the larger current, develops a large positive output signal across any external load connected to output 28. The magnitude of this output signal is only slightly less than the potential at the collector of "cut-off" transistor $Q_1$ and is typically $\frac{2}{3}\cdot E$. The operation of the amplifier during the negative half cycle of input signal is entirely analogous and will not be discussed in detail.

One experimental bipolar amplifier actually built and tested had the following component values:

| Component: | Value |
|---|---|
| R14 | 500Ω. |
| R11, 12 | 7.5KΩ. |
| R21, 24 | 2.2MΩ. |
| C22, 26 | 0.1 pf. |
| Q1, 4 | 2N3500. |
| Q2, 3 | 2N3636. |
| E | ±150 v. |
| $E_{in}$ | ±5 v. p. to p. |
| $E_{out}$ | ±100 v. p. to p. |

The above amplifier was found to have a rise time of 1 to 1.5 microseconds and a slewing rate of approximately 200 v./microsecond with an output signal of ±100 v. peak-to-peak. This compares most favorably with typical commercially available operational amplifiers which, when delivering a ±100 v. peak-to-peak output, have a slewing rate of only 20 v./microsecond or, alternatively, when selected to have a 100 v./microsecond slewing rate can only deliver a ±10 v. peak-to-peak output signal.

Figure 2:
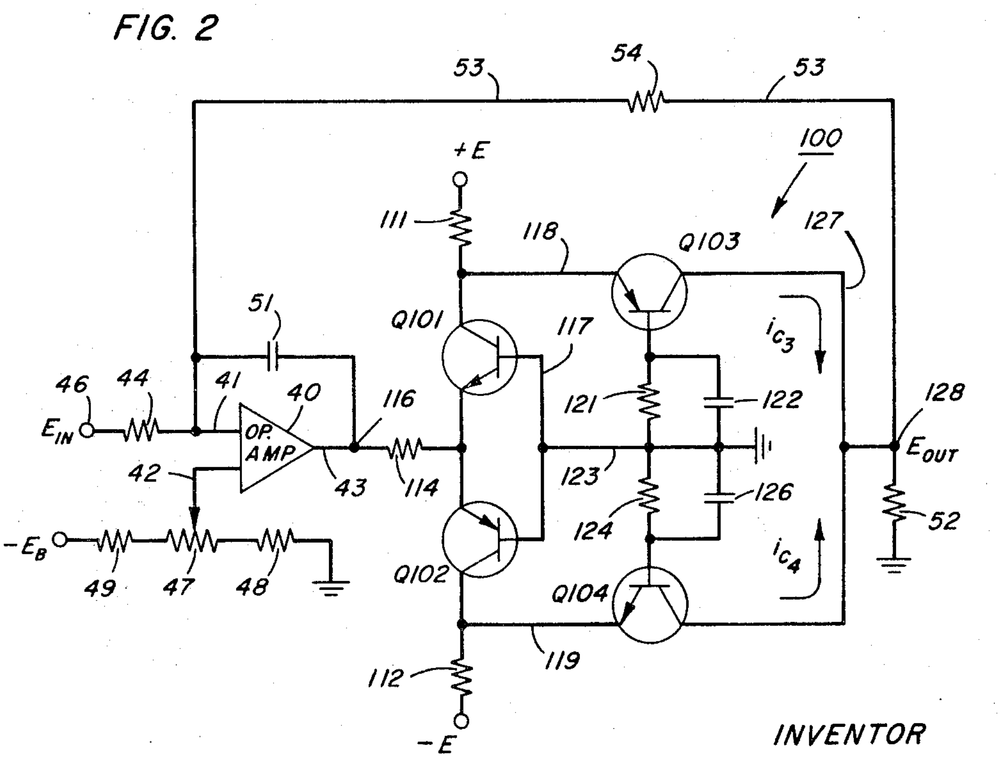
FIG. 2 is a schematic drawing of a transistorized bipolar amplifying circuit including an operational amplifier and the bipolar amplifier illustrated in FIG. 1.

FIG. 2 illustrates the use of the above-described bipolar amplifier with an operational amplifier to provide a bipolar amplifying circuit. As shown, the circuit comprises an operational amplifier 40 coupled to a bipolar amplifier 100. Bipolar amplifier 100 is identical to bipolar amplifier 10 in FIG. 1 and its elements and manner of operation will not therefore be described in detail.

Operational amplifier 40 has a first input 41, a second input 42 and an output 43. The first input 41 is connected via a resistor 44 to an input terminal 46. The other input 42 is connected to the slider arm of a variable resistor 47 which is serially connected with a resistor 48 and a resistor 49 in a circuit interconnecting a source of negative bias —E*b* and ground. The output 43 of operational amplifier 40 is connected to input 116 of bipolar amplifier 100. A capacitor 51 is connected across first input 41 and output 43 of operational amplifier 40. This capacitor is provided to suppress spurious oscillations and may be omitted in some applications. The output 128 of bipolar amplifier 100 is connected to a load resistor 52, thence to ground and also via a feedback loop 53, including a resistor 54, to the first input 41 of operational amplifier 40.

In operation, variable resistor 47 is adjusted so that operational amplifier 40 draws no input current, as is well known in the art. Input signals applied to input 46 are fed through resistor 44 to the input 41 of operational amplifier 40. A low-level amplified replica of the input signals appears on output 43 and these amplified signals are fed via resistor 114 to the emitters of transistors $Q_{101}$ and $Q_{102}$.

As more fully explained with reference to FIG. 1, high-level output signals are developed across load resistor 52 at output 128. Feedback loop 53 feeds a portion of the output signals developed across load resistor 52 via resistor 54 to the input of operational amplifier 40 to provide negative feedback, reduce the overall gain of the circuit, and improve stability.

In an experimental bipolar amplifier circuit actually constructed and tested, the components had the following values:

| Component: | Value |
|---|---|
| R44 | 10,000Ω. |
| R49 | 10,941.1Ω. |
| R47 | 1,000Ω. |
| R48 | 10,000Ω. |
| R54 | 232Ω. |
| R52 | 1.27MΩ. |
| C51 | 20 pf. |
| —E*b* | 10.510 v. |

All the other components were as detailed in connection with FIG. 1. Advantageously, resistors 44, 47, 48, 49 and 54 are accurate to 0.01% or better. The operational amplifier 40 was an Analog Devices Model 102 having an open loop gain of $2\times10^6$, an output voltage of ±11 v. peak-to-peak and a unity-gain, small-signal frequency response of 10 mHz. By virtue of the feedback loop, the bipolar amplifying circuit was found to be extremely stable over wide variations in input signal, temperature and supply voltages, and the short term stability was found to exceed 10 parts per million.

It will be apparent to one skilled in the art that various changes and substitutions may be made in the polarity of the components and power supply without affecting the basic operation of the circuit. It will be further understood that various changes in the details, components or arrangements of parts which have been described and illustrated in order to explain the nature of the invention may be made by those skilled in the art within the principles and scope of the invention.

What is claimed is:

1. A bipolar amplifier which comprises:

first and second transistors of opposite polarity each having a base, an emitter and a collector;

circuitry connecting voltage sources of opposite polarity to the collectors of said first and second transistors, respectively;

input circuitry connecting the signal to be amplified to the emitters of said first and second transistors;

circuitry interconnecting the bases of said first and second transistors and a source of reference potential;

third and fourth transistors of opposite polarity, each having a base, an emitter and a collector, the emitters of said third and fourth transistors being connected to the collectors of said first and second transistors, respectively, for amplifying in Class B fashion the voltages developed thereacross to produce an output signal;

first and second resistors connecting the bases of said third and fourth transistors to said source of reference potential, respectively; and circuitry interconnecting the collectors of said third and fourth transistors to develop said output signal, the interconnection of said first, second, third, and fourth transistors being such that the collector-to-emitter potential developed across any one of said transistors is substantially less than the algebraic difference of said voltage sources of opposite polarity, thereby permitting the use of transistors having improved transient response so that said amplifier exhibits a relatively high slewing rate and, by virtue of the alternate conduction of said first and third and said second and fourth transistors, respectively, said amplifier additionally exhibits low overall distortion caused by the inherent crossover distortion in said transistors.

2. A bipolar amplifier according to claim 1 further comprising:

third and fourth resistors intermediate said sources of opposite polarity and the collectors of said first and second transistors, respectively.

3. A bipolar amplifier according to claim 2 further comprising:

a fifth resistor connected in said input circuitry intermediate the signal to be amplified and the emitters of said first and second transistors.

4. A bipolar amplifier according to claim 3, further comprising:

first and second capacitors connected across said first and second resistor, respectively to improve the transient response of said amplifier.

References Cited

UNITED STATES PATENTS

| | | | |
|---|---|---|---|
| 2,860,193 | 11/1958 | Lindsay. | |
| 3,426,245 | 2/1969 | Yurasek et al. | 330—17X |

ROY LAKE, Primary Examiner

L. J. DAHL, Assistant Examiner

U.S. Cl. X.R.

330—17